United States Patent
Furuta

(10) Patent No.: US 6,363,132 B1
(45) Date of Patent: Mar. 26, 2002

(54) ASYNCHRONOUS DATA CONVERSION SYSTEM FOR ENABLING ERROR TO BE PREVENTED

(75) Inventor: Yuji Furuta, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/140,703

(22) Filed: Aug. 26, 1998

(30) Foreign Application Priority Data

Aug. 26, 1997 (JP) .............................................. 9-229781

(51) Int. Cl.[7] ................................................. H04L 7/00
(52) U.S. Cl. .................... 375/372; 365/189.05; 714/719
(58) Field of Search ................... 375/372, 354, 375/370; 365/189.01, 189.04, 189.05, 189.6, 205, 219–221; 340/10.51, 825.83; 714/719, 703, 707, 725; 711/155

(56) References Cited

U.S. PATENT DOCUMENTS 5,587,953 A * 12/1996 Chung ......................... 365/220
5,956,748 A * 9/1999 New ............................ 711/149

FOREIGN PATENT DOCUMENTS

JP 3-268530 11/1991
JP 8-237232 9/1996

* cited by examiner

Primary Examiner—Chi Pham
Assistant Examiner—Emmanuel Bayard
(74) Attorney, Agent, or Firm—Ostrolenk, Faber, Gerb & Soffen, LLP

(57) ABSTRACT

An asynchronous data conversion system enables high conversion efficiency and reliability to be secured because it is capable of preventing lack of the data or redundancy of the data, and if lack of the data or redundancy of the data occurs, it is capable of detecting it by way of error. In a system where a write clock is asynchronized with a read clock, from the state relationship of HIGH/LOW in between a write enable signal and a read enable signal, a write ready signal with a writing to a latching section as holding state, a read ready signal with a reading-out as holding state are generated at a ready signal generating section synchronized with the write clock. When it is incapable of writing to latching section newly, outputting a write error signal from a write error detecting section. When the data for reading-out to the latch section does not exist, outputting the read error signal from the read error detecting section.

16 Claims, 12 Drawing Sheets

| STATE | OUTPUT SIGNAL | |
|---|---|---|
| | WRDY-0 | RRDY-0 |
| Iw | Low | Hi |
| Tw1 | Hi | Low |
| Tw2 | Hi | Hi |

| STATE | OPERATION MODE | OUTPUT SIGNAL ACK-0 |
|---|---|---|
| Ir | B-Mode | Hi |
| Tr1 | B-Mode | Hi |
| Tr2 | B-Mode | Low |
| Any State | A-Mode | RE-0 |

FIG. 14

| INPUT SIGNAL | | | OUTPUT SIGNAL |
|---|---|---|---|
| WRDY-0 | WE-0 | WCLK | WERR-0 |
| Hi | Low | ↑ | Low |
| Low | — | ↑ | Hi |
| — | Hi | ↑ | Hi |

FIG. 15

| INPUT SIGNAL | | | OUTPUT SIGNAL |
|---|---|---|---|
| RRDY-0 | RE-0 | RCLK | RERR-0 |
| Hi | Low | ↑ | Low |
| Low | — | ↑ | Hi |
| — | Hi | ↑ | Hi |

ASYNCHRONOUS DATA CONVERSION SYSTEM FOR ENABLING ERROR TO BE PREVENTED

BACKGROUND OF THE INVENTION

The present invention relates to an asynchronous data conversion system. More particularly, this invention relates to an asynchronous data conversion system which causes an input data synchronous with one clock to be synchronized with another clock and output, in a digital circuit which operates by using, two kinds of asynchronous clocks.

Description of the Related Art

In the Japanese Patent Application Laid-Open No. HEI 8-237232, by way of conventional technology, a data change circuit is disclosed. The data change circuit comprises a data detecting section for causing input data to be synchronized with the reception clock to be latched to D-type flip-flop, and a data change section for causing the output thereof to be latched to D-type flip-flop by a transmission clock. The data change circuit also comprises a data change timing generating section, and a data change timing synchronizing section. The output of the data change section is taken to be output data, and the enable input signal of respective D-type flip-flops is controlled by the data change timing generating section and the data change timing synchronizing section.

In one example (embodiment 5) of this data change circuit, when the difference between two kind of clocks is sufficiently large, judging whether or not the same detected data continues to appear during the period corresponding to a plurality of clock cycles, while monitoring detected data synchronous with the master clock for the sake of a transmission clock during fixed time interval, and thus it enables the detected data to be changed by using transmission clock without generation of data change timing from the reception clock, caused by generation of the timing pulse which indicates the timing not existing change point of the detected data and which is synchronized with the master clock.

Further, in another example (embodiment 3) thereof, when both of a reception clock and a transmission clock are unknown, there is provided with a clock frequency comparison means, and a data change timing generating means, wherein the data change timing generating means controls pulse width of a data change timing pulse while receiving clock width binary data outputted from the clock frequency comparison means.

On the other hand, in the Japanese Patent Application laid-Open No. HEI 3-268530, which causes two kinds of a first and a second clocks to be prepared, thus latching an input data by the first clock, and latching output thereof by the second clock. Then in the output timing, there is observed both of the timing of the first clock and the timing of the second clock, thus outputting data which does not overlap with transmission latch timing pulse (which meets both of set up time and hold time). Thus, the data change method of asynchronous circuit is disclosed.

However, according to such conventional technology, after one of the data is inputted, before outputting data to the output side accurately or before receiving data outputted by the output side, when the second data is inputted, the output data is updated to the second data, with the result that lack of the data occurs.

Further, in cases where read-out is implemented before the output data is prepared, there is the possibility that prior data by one is outputted repeatedly, however there is not provided the function to detect the error.

The embodiment 5 described in the above Japanese Patent Application Laid-Open No. HEI 8-237232 has good conversion efficiency, when the difference between two kinds of clocks is sufficiently large, while when difference of the clock is obscure, it is incapable of using it. On the other hand, according to the embodiment 3 described in the gazette, there is no such the matter, however, conversion efficiency is inferior.

SUMMARY OF THE INVENTION

In view of the foregoing, it is an object of the present invention to provide an asynchronous data conversion system which is capable of preventing lack of data or redundancy of data and if lack or redundancy occurs, it is capable of detecting by way of error, and because it causes operation mode to be switched in relation to the case either difference of speed of two kind of clocks is sufficiently large or another case, the asynchronous data conversion system is capable of securing high conversion efficiency and high reliability without influence of size of difference of the clock.

In one arrangement to be described below by way of example in illustration of the present invention, an asynchronous data conversion system wherein input data is written in a latching section synchronously with a write clock in accordance with a write enable signal, subsequently the written data is read-out synchronously with a read clock which is asynchronous with the write clock, in accordance with a read enable signal, the asynchronous data conversion system comprises a ready signal generating section which generates a write ready signal with a writing to the latching section as holding state, and a read ready signal with a reading-out from the latching section as holding state synchronously with the write clock from the state relationship of HIGH/LOW in between the write enable signal and the read enable signal.

In another arrangement to be described by way of example in illustration of the present invention, an asynchronous data conversion system wherein input data is written in a latching section synchronously with a write clock in accordance with a write enable signal, subsequently the written data is read-out synchronously with a read clock which is asynchronous with said write clock, in accordance with a read enable signal, the asynchronous data conversion system comprises a ready signal generating section which generates a write ready signal with the writing to the latching section as holding state, and a read ready signal with the reading-out from the latching section as holding state synchronously with the write clock from state relationship of HIGH/LOW in between the write enable signal and the read acknowledge signal, and a read acknowledge signal generating section which generates the acknowledge signal synchronously with the read clock from the state relationship of HIGH/LOW in between the read enable signal and the read ready signal.

In yet another arrangement to be described below by way of example in illustration of the present invention, an asynchronous data conversion system wherein input data is written in a latching section synchronously with a write clock in accordance with a write enable signal, subsequently the written data is read-out synchronously with a read clock which is asynchronous with said write clock in accordance with a read enable signal, the asynchronous data conversion system comprises a ready signal generating section which generates a write ready signal with the writing to the latching section as holding state, and a read ready signal with the reading-out from the latching section as holding state synchronously with the write clock from the state relationship of HIGH/LOW in between the write enable signal and the read acknowledge signal, and a read acknowledge signal generating section which generates the acknowledge signal synchronously with the read clock from the state relationship of HIGH/LOW in between the read enable signal and the read ready signal.

In one particular arrangement to be described below by way of example in illustration of the present invention, the asynchronous data conversion system described above further comprises a write error detecting section which outputs a write error signal synchronously with the read clock depending on a state relationship of HIGH/LOW in between a write enable signal and a write ready signal, and a read error detecting section which outputs a read error signal synchronously with a read clock depending on a state relationship of HIGH/LOW in between a read enable signal and a read ready signal.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 14 is a relationship view showing the relationship between an input signal and an output signal in a write error detecting section; and FIG. 15 is a relationship view showing, the relationship between an input signal and an output signal in a read error detecting section.

DETAILED DESCRIPTION OF THE PREFERRED EMBODIMENTS

A preferred embodiment of the present invention will now be described in detail referring to the accompanying drawings.

Figure 1:
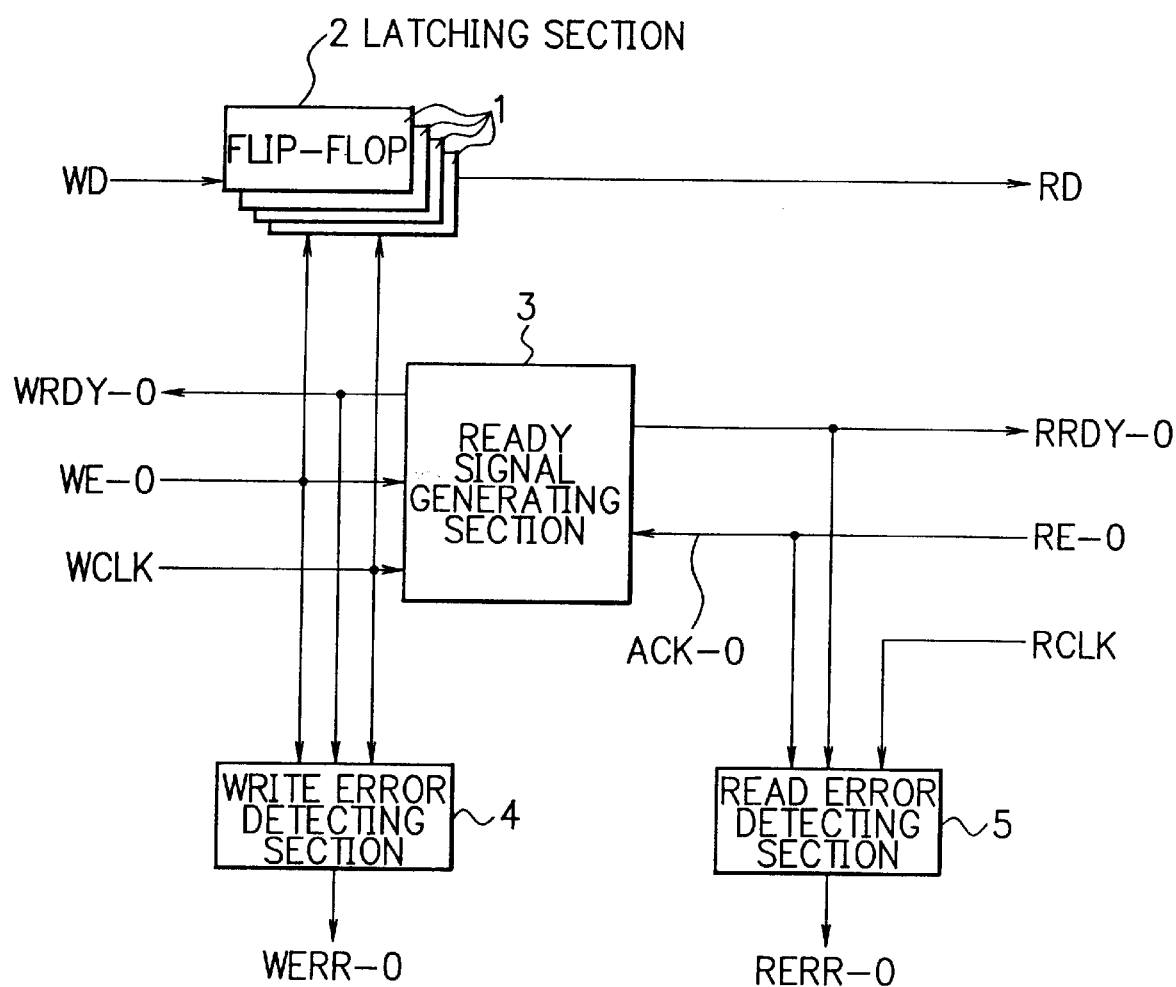
FIG. 1 is a block diagram showing a first embodiment of the present invention.
Figure 2:
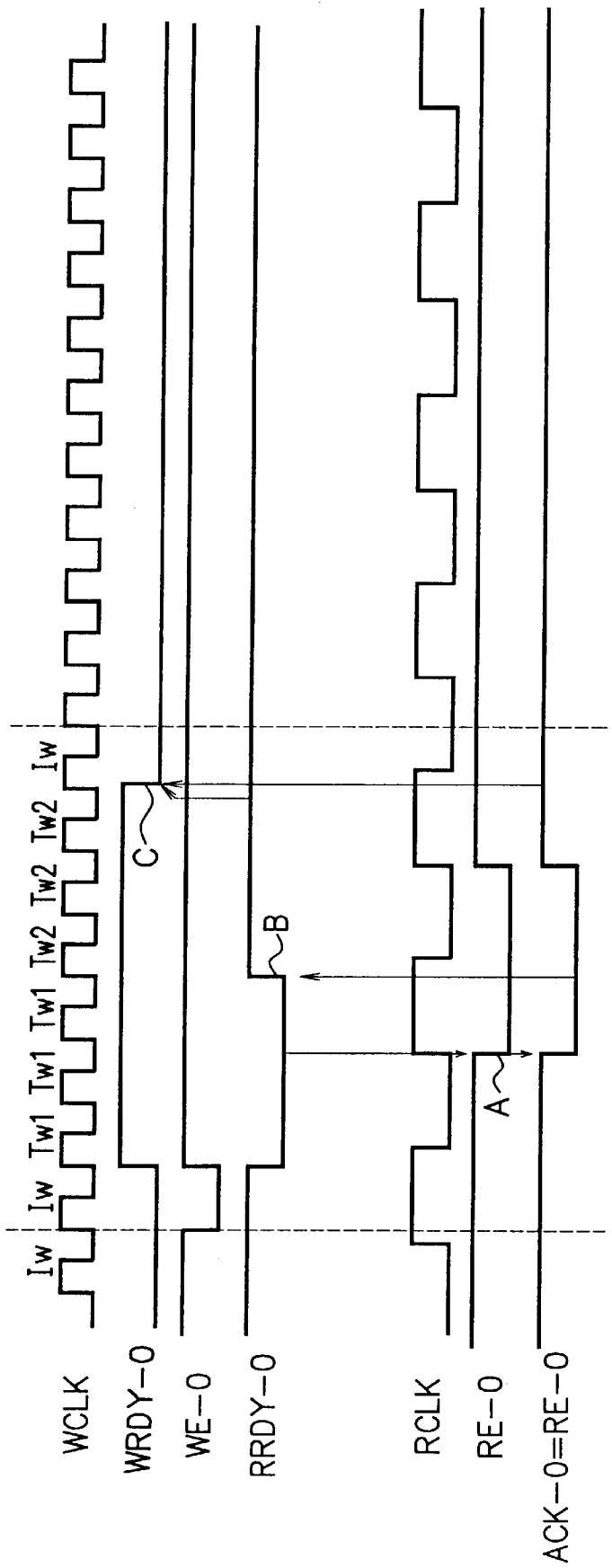
FIG. 2 is a timing chart showing an example of timing when a write clock is sufficiently fast in comparison with a read clock in the first embodiment.

FIG. 1 is a view showing a first embodiment of an asynchronous data conversion system of the present invention. The asynchronous data conversion system comprises a latching section 2 consisting of a plurality of flip-flops 1, a ready signal generating section 3, a write error detecting section 4, and a read error detecting section 5. This asynchronous data conversion system is capable of applying to the case where the write clock WCLK in relation to the flip-flop 1 is sufficiently faster than the read clock RCLK as shown in FIG. 2.

The flip-flop 1 latches the write data (input data) WD at the leading edge of the write clock WCLK when write enable signal WE-0 is LOW. The latched data is read-out by way of read data RD.

The write clock WCLK, the write enable signal WE-0, the read acknowledge signal (in this embodiment, read acknowledge signal is the same as the read enable signal RE0) ACK-0 are inputted to the ready signal generating section. The ready signal generating section 3 generates both of a write ready signal WRDY-0 which sets writing to the latching section 2 to a hold state and a read ready signal RRDY-0 which sets read-out from the latching section 2 to a hold state, synchronous with a write clock WCLK in answer to the HIGH/LOW state both of write enable signal WE0 and read acknowledge signal ACK-0.

The write error detecting section 4 generates a write error signal WERR-0 while monitoring the state relationship of HIGH/LOW in terms both of the write ready signal WRDY-0 and the write enable signal WE-0 at the leading edge of the write clock WCLK.

The read error detecting section 5 generates the read error signal RERR-0 while monitoring the state relationship of HIGH/LOW in terms of the read ready signal RRDY-0 and the read enable signal RE-0 at the leading edge of the read clock RCLK.

Operation of the first embodiment shown in FIG. 1 will be described referring to timing chart of FIG. 2.

With respect to the writing to the latching section 2, under normal condition, the writing becomes possible at the leading edge of the write clock WCLK, while when the write ready signal is LOW, the writing becomes possible at the leading edge of the next write clock WCLK. At this state, the writing is executed such that it causes the write enable signal WE-0 to be set to LOW at the leading edge of the write clock WCLK. Here, it causes the write enable signal WE-0 to be set to LOW only during 1 clock of the write clock WCLK. Namely, when once it causes the write enable signal WE-0 to be set to LOW at the leading edge of the write clock WCLK, the write enable WE-0 is set to HIGH at the leading edge of the next write clock WCLK. If this is done, at the leading edge of the write clock WCLK, when the write ready is LOW, the writing is capable of implementing again at the leading edge of the next write clock WCLK.

With respect to the reading-out from the latching section 2, the reading-out becomes possible at the leading edge of the read clock RCLK, while when the read ready signal is LOW, the reading-out becomes possible at the leading edge of the next read clock RCLK. At this time, since the read ready signal RRDY-0 is generated synchronously with the write clock WCLK, and being asynchronous with the read clock RCLK, there is the danger that set up time or hold time is insufficient, while changing the read ready signal RRDY-0 at the leading edge of the read clock RCLK. For this reason, in the circuit which uses the data after conversion by the system shown in FIG. 1, the read ready signal RRDY-0 from the ready signal generating section 3 is in use. This circuit is the circuit which does not continue to oscillate when the set up time and the hold time are once insufficient. The circuit converges on either HIGH or LOW immediately, while it is indefinite whether HIGH occurs or LOW occurs. Further, if there is satisfied the set up time and the hold time at the leading edge of the next read clock RCLK, it is capable of recognizing the read ready signal RRDY-0 in terms of the circuit appropriately.

If the circuit is such circuit, for instance, in cases where the read ready signal RRDY-0 changes from HIGH into LOW, even though the set up time or the hold time is insufficient at the leading edge of the read clock RCLK, although HIGH is recognized at the change point, since the set up time and the hold time are satisfied correctly at the leading edge of the next read clock RCLK, with the result that LOW is recognized. While, when LOW is recognized, it is recognized by way of the read ready state, correct operation is implemented.

Figures 10, 11:
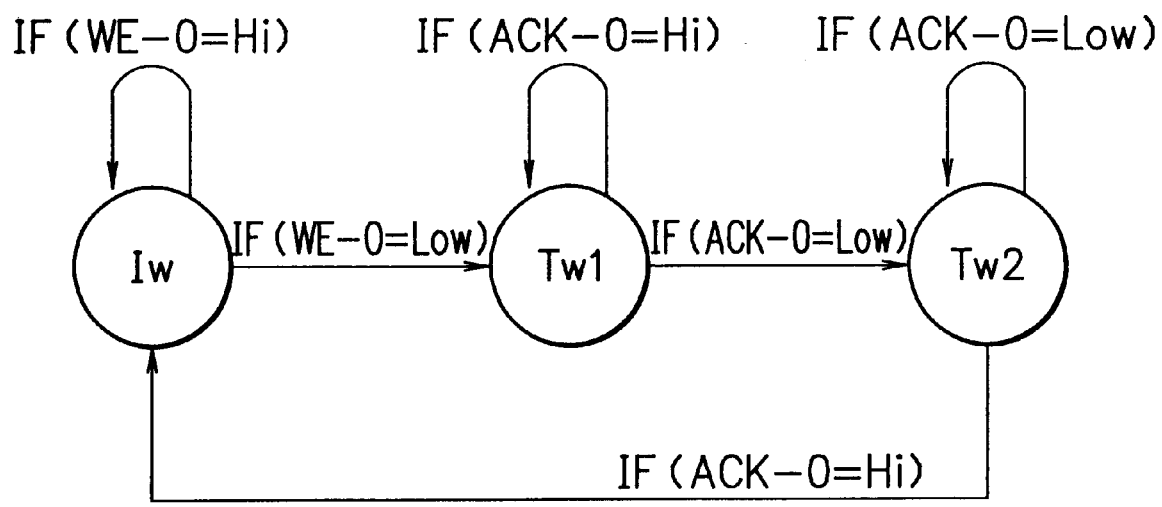
FIG. 10 is an operation transition view showing operation of ready signal generating section.
FIG. 11 is a view showing output configuration of a write ready signal and read ready signal according to a ready signal generating section.

FIG. 10 is an operation transition view showing operation of ready signal generating section 3. FIG. 11 is a view showing change of HIGH/LOW of write ready signal and read ready signal according to ready signal generating section. Operation of the ready signal generating section 3 will be described referring to these drawings.

The ready signal generating section 3 changes the write ready signal WRDY-0 and the read ready signal RRDY-0 due to three states of Iw1, Tw1, and Tw2, and the initial state thereof become Iw2. At this time, the write ready signal WRDY-0 becomes LOW, and the read ready signal RRDY-0 becomes HIGH, thus they stay at the Iw1 state until the write enable signal becomes LOW.

After this time, the write enable signal WE-0 becomes LOW during 1 clock, thus the write ready signal WRDY-0, and the read ready signal RRDY-0, shifting to Tw1 state. Under this state, the write ready signal WRDY-0 becomes HIGH, and read ready signal RRDY-0 becomes LOW, thus staying at Tw1 state until the read acknowledge signal ACK-0 (in this case, the read acknowledge signal ACK-0 is the same as the read enable signal RE-0) becomes LOW.

In this circumstance, when the read ready signal RRDY-0 is LOW, if the leading edge of the read clock RCLK is generated, the reading-out from the latching section 2 becomes possible because it causes the read enable signal RE-0 to be set to LOW after the next clock.

In the timing chart of FIG. 2, it causes the read enable signal RE-0 to be set to LOW at the timing of A, thus returning it to HIGH after 1 clock interval of the read clock RCLK. The read enable signal RE-0 is in use by way of the read acknowledge signal ACK-0 as it is, thereby the read acknowledge signal ACK-0 becomes LOW during 1 clock interval of the read clock RCLK.

The ready signal generating section 3, as shown in FIG. 10, shifts to the Tw2 state when the read acknowledge signal ACK-0 becomes LOW. Under this state, both the write ready signal WRDY-0 and the read ready signal RRDY-0 become HIGH, thus staying at the Tw2 state until the read acknowledge ACK-0 becomes HIGH.

The read acknowledge signal ACK-0 becomes HIGH after 1 clock interval of the read clock RCLK, thereby, the ready signal generating section 3 returns to Iw state. Under this state, the write ready signal WRDY-0 becomes LOW, and the read ready signal RRDY-0 becomes HIGH. By repetition of such operation, the write data WD is capable of being converted correctly to the read data RD synchronous with the read clock RCLK, without occurrence of lack of the data and redundancy of the data.

Next, operation of the write error detecting section 4 will be described referring to FIG. 14.

Since it is the state that the data exists in the flip-flop 1, when it is incapable of being written data newly, the write ready signal WRDY-0 becomes HIGH. When the write ready signal WRDY-0 is HIGH, and the write enable signal WE-0 is LOW, if the leading edge of write clock WCLK is generated, it is writing error. In this circumstances, the writing is implemented before the first data is readout, thus it becomes lack of the data. At this time, the write error detecting section 4 causes the write error signal WERR-0 to be set Lo LOW by way of the fact that write error occurs.

Operation of the read error detecting section 5 will be described referring to FIG. 15.

When no data for reading-out exists in the flip-flop 1, the read ready signal RRDY-0 becomes HIGH. When the read ready signal RRDY-0 is HIGH, and the read enable signal RE-0 is LOW, if the leading edge of the read clock RCLK is generated, thus it is the reading-out error. In this state, the reading-out is implemented before new data is written, it becomes the repeated reading-out. At this time, the read error detecting section 5 causes the read error signal RERR-0 to be set to LOW by way of the fact that the read error occurs.

Figure 3:
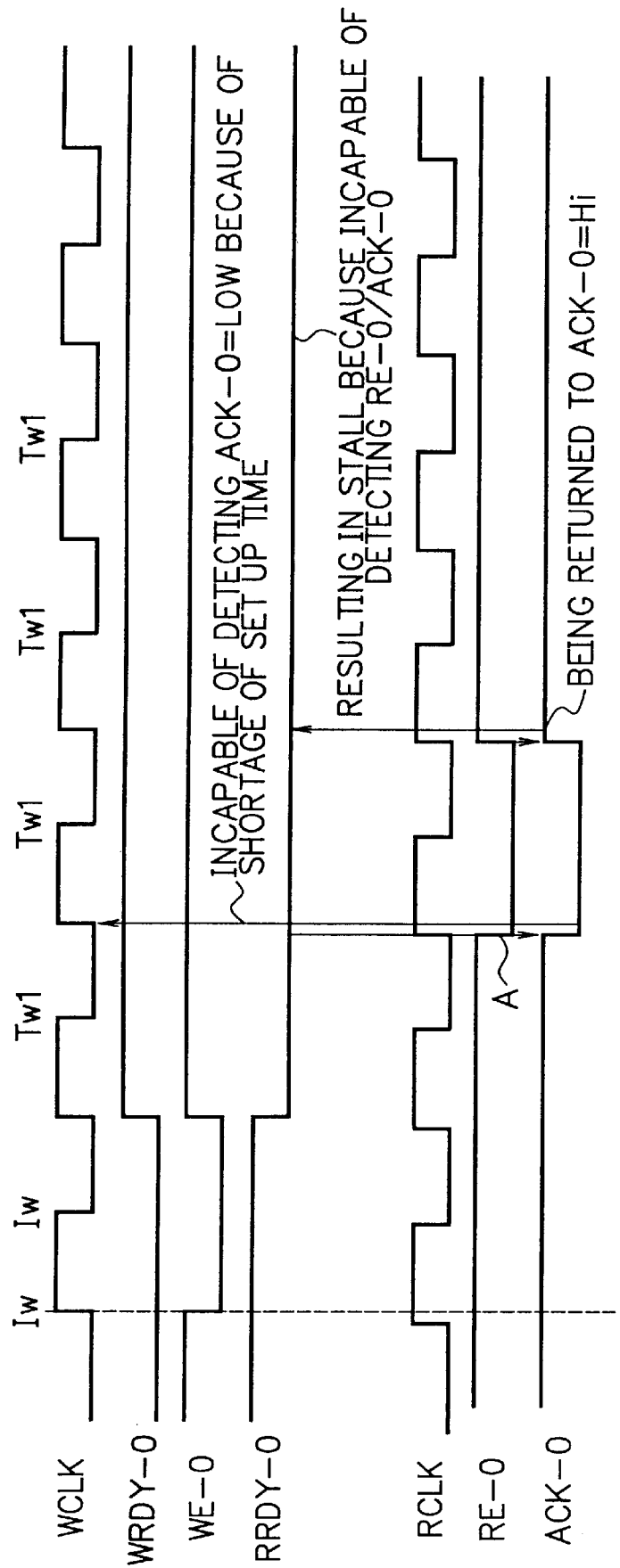
FIG. 3 is a timing chart showing an example of timing when the difference of speed in between the write clock and the read clock is small in the first embodiment.

Now, as shown in FIG. 3, when the frequency of the write clock WCLK and the frequency of the read clock RCLK are near frequencies with each other, the system is incapable of being operated correctly by only configuration shown in FIG. 1 caused by the following reasons.

When the read enable signal RE-0 becomes LOW at the timing of A indicated in FIG. 3, the ready signal generating section 3 is incapable of detecting the read acknowledge signal ACK-0 because of deficiency of the set up time. The read enable signal RE-0 becomes HIGH at the next read clock RCLK. Here also the ready signal generating section 3 is incapable of detecting the read acknowledge signal ACK-0. For this reason, the ready signal generating section 3 continues to stay at the Tw1 state, thus becoming stall state.

Figure 4:
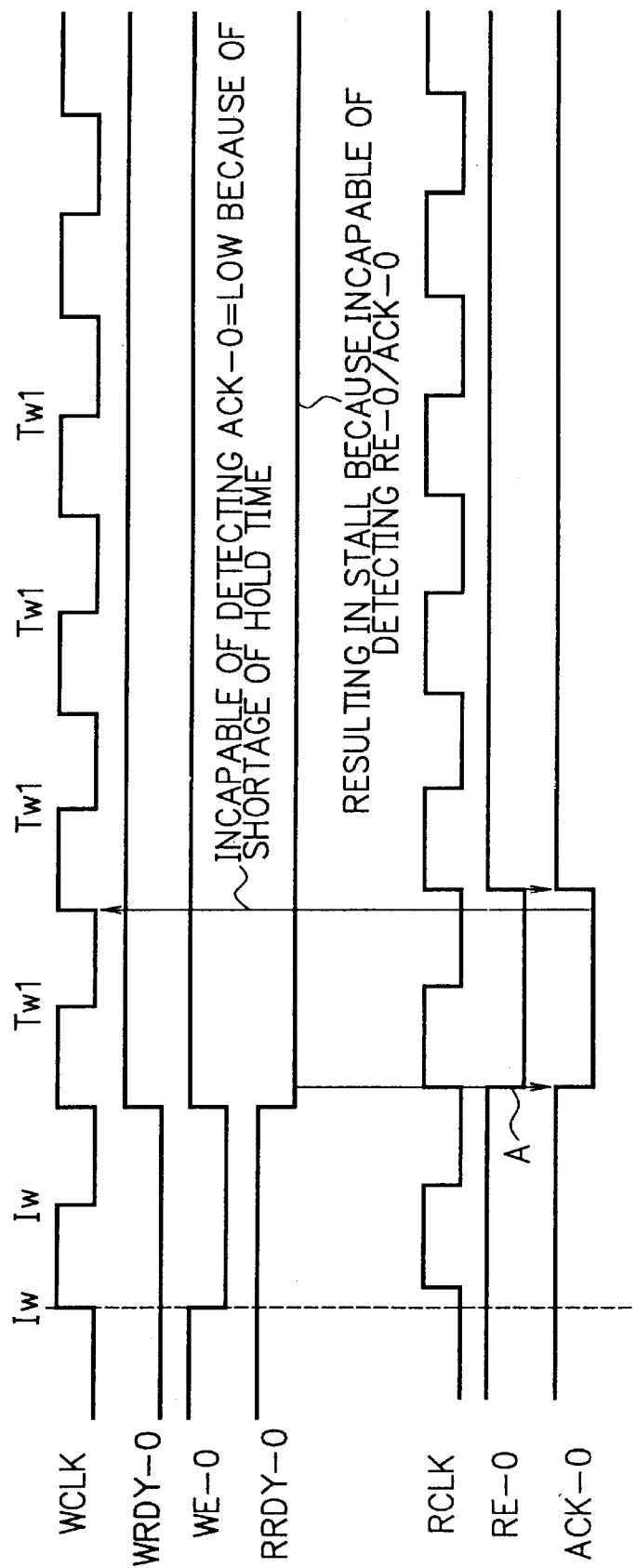
FIG. 4 is a timing chart showing another example of timing similar thereto.

Further, FIG. 4 shows another example of the case where the frequency of the write clock WCLK and the frequency of the read clock RCLK are near frequencies with each other. When the read enable signal RE-0 becomes LOW at the timing of A indicated in FIG. 4, in the read acknowledge signal ACK-0, hold time is insufficient at the leading edge of the next write clock WCLK. Here also the ready signal generating section 3 is incapable of detecting the read acknowledge signal ACK-0. For this reason, the ready signal generating section 3 continues to stay at the Tw1 state, thus becoming the stall state.

Figure 5:
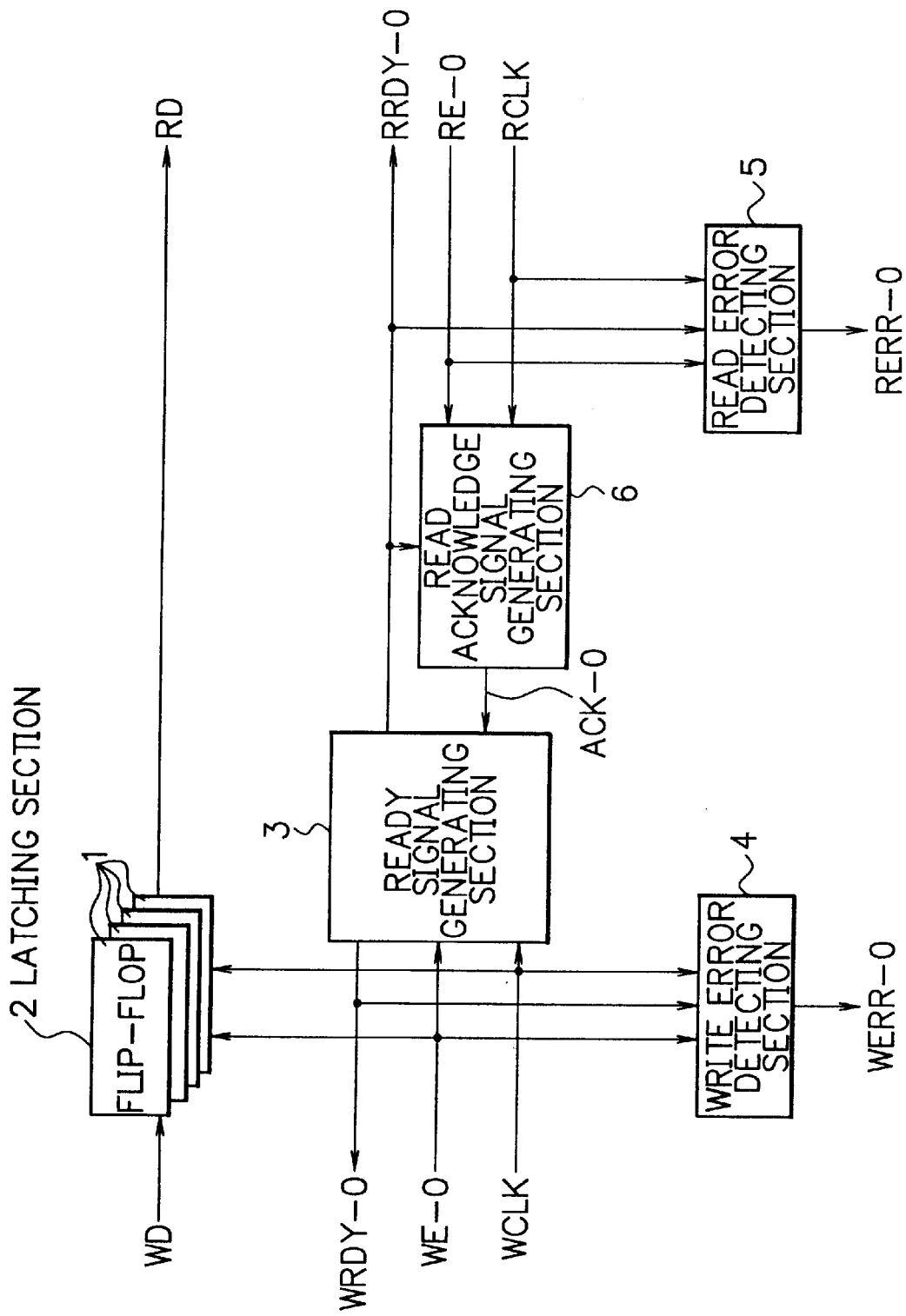
FIG. 5 is a block diagram showing a second embodiment of the present invention.
Figures 12, 13:
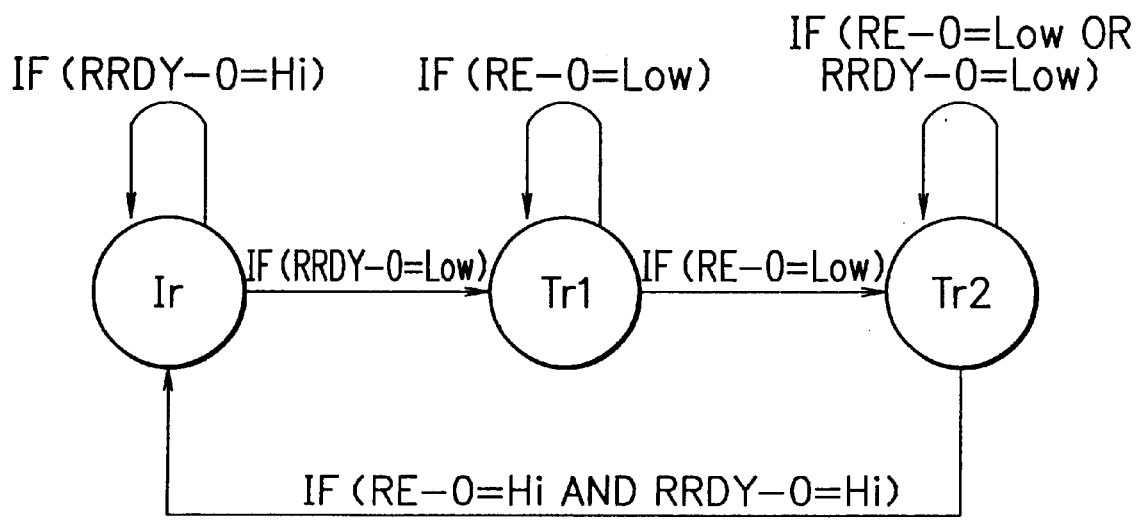
FIG. 12 is an operation transition view showing operation of a read acknowledge signal generating section.
FIG. 13 is a view showing output configuration of the read acknowledge signal according to read acknowledge signal generating section.

FIG. 5 is a block diagram showing a second embodiment of the present invention. In the second embodiment of FIG. 5, in order to avoid above-described situation, a read acknowledge signal generating section 6 is added to the configuration of FIG. 1 shown in FIGS. 3 and 4, so as to generate the read acknowledge signal ACK-0 synchronized with the read clock RCLK from the state relationship of HIGH/LOW signal RRDY-0. FIG. 12 is an operation transition view showing operation of read acknowledge signal generating section 6. FIG. 13 is a view showing output configuration of the read acknowledge signal according to the read acknowledge signal generating section. Namely, FIG. 12 shows state transition of the read acknowledge signal generating section, and FIG. 13 shows variation of the read acknowledge signal ACK-0 caused by the state transition.

In the second embodiment of FIG. 5, the latching section 2, the write error detecting section 4, and the read error detecting section 5 are the same as those of the first embodiment shown in FIG. 1, therefore, operation explanation thereof will be omitted. The operational relationship of the read acknowledge signal generating section 6 and the ready signal generating section 3 will be described referring to FIGS. 10 to 13, and timing chart of FIG. 6. For convenience of the description, the operation only according to the configuration of FIG. 1 is shown as "A-Mode", operation to which the read acknowledge signal generation section of FIG. 5 is added is shown as "B-Mode".

Figure 6:
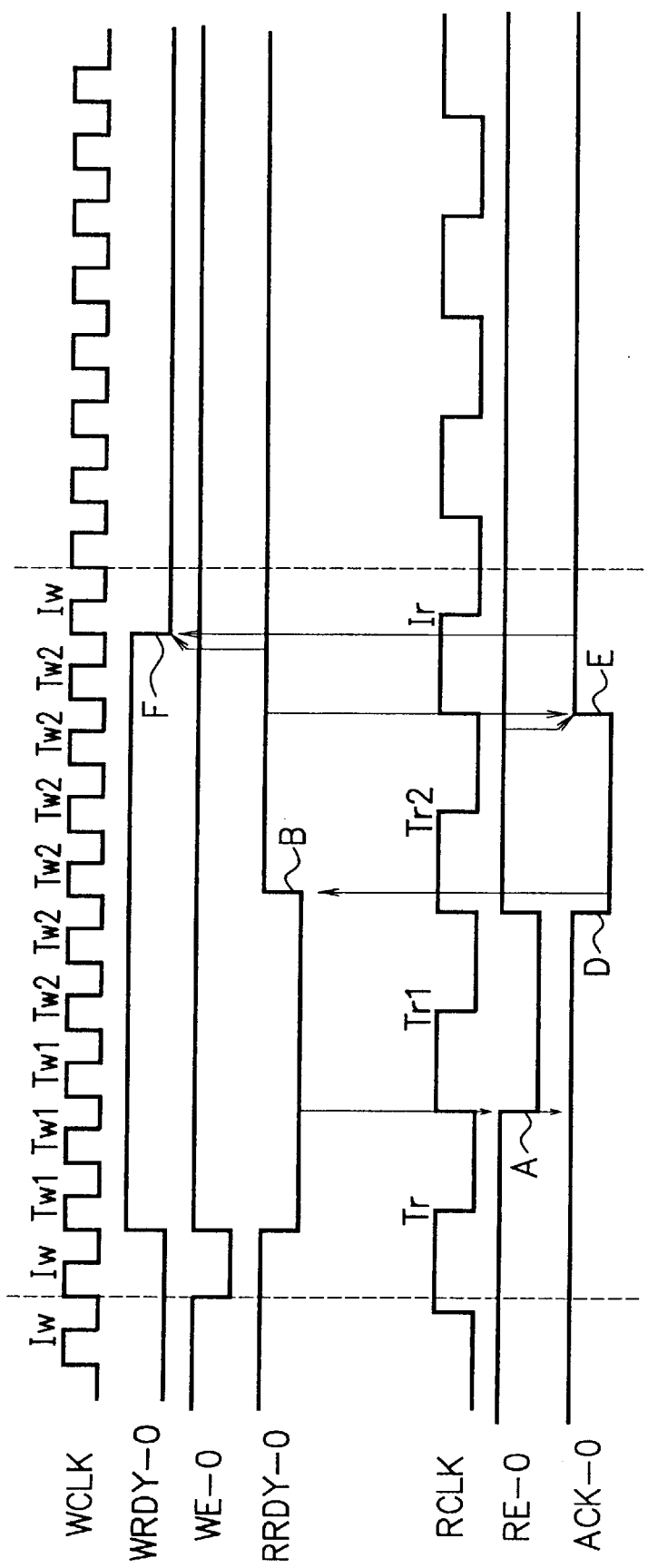
FIG. 6 is a timing chart showing an example of timing when the write clock is sufficiently fast in comparison with the read clock in the second embodiment.

FIG. 6 is one example of the timing when the write clock WCLK is sufficiently fast in comparison with the read clock RCLK. In the initial state, the ready signal generating section 3 is of the Iw state, the read acknowledge signal generating section 6 is of the Ir state. At this time, as shown in FIG. 11, the write ready signal WRDY-0 becomes LOW, and the read ready signal RRDY-0 becomes HIGH. As shown in FIG. 13, in the second embodiment of FIG. 5, the operation mode is fixed to "B-Mode", in the Ir state, the read acknowledge signal ACK-0 becomes HIGH. As shown in FIG. 10, the ready signal generating section 3 stays at Ir state until the write enable signal WE-0 becomes LOW. Further, as shown in FIG. 12, the read acknowledge signal generating section 6 stays at Ir state until the read ready signal RRDY0 becomes LOW.

Subsequently, as shown in FIG. 10, when the write enable signal WE-0 becomes LOW during 1 clock interval of the write clock WCLK, the ready signal generating section 3 shifts to Tw1 state. Under this circumstance, as shown in FIG. 11, the write ready signal WRDY-0 becomes HIGH, and the read ready signal RRDY-0 becomes LOW. Then the ready signal generating section 3 stays at Tw1 state until the read acknowledge signal ACK-0 becomes LOW.

On the other hand, the read acknowledge signal generating section 6 shifts to the Trl state at the leading edge of the next read clock RCLK after the read ready signal RRDY-0 becomes LOW. Subsequently, as shown in FIG. 13, the read acknowledge signal generating section 6 stays at the Tr1 state until the read enable signal RE-0 becomes LOW.

At the LOW state of the read ready signal RRDY-0, the leading edge of the read clock RCLK is generated, since it causes the read enable signal RE-0 to be set to LOW after next clock, it becomes possible to perform reading-out of the data from the latching section 2. In FIG. 6, it causes the read enable signal RE-0 to be set to LOW at the timing of A indicated therein, and then causes the read enable signal RE-0 to be returned to HIGH after 1 clock interval of the read clock RCLK.

Next, as shown in FIG. 12, the read enable signal RE-0 is LOW, and when the leading edge of the read clock is generated, the read acknowledge signal generating section 6 shifts to Tw2. At this time, as shown in FIG. 13, the read acknowledge signal ACK-0 becomes LOW. Then, the read acknowledge signal generating section 6, as shown in FIG. 12, stays at the Tr2 state until the read enable signal RE-0 is HIGH, and the read signal RPDY-0 becomes HIGH.

As shown in FIG. 10, when the read acknowledge signal ACK-0 becomes LOW, before the leading edge of the next write clock WCLK is generated, the ready signal generating section 3 shifts to Tw2 state. At this time, as shown in FIG. 11, the write ready signal WRDY-0 becomes HIGH, and the read ready signal becomes LOW. The ready signal generating section 3 stays at Tw2 state until the read acknowledge signal ACK-0 becomes HIGH.

The read ready signal RRDY-0 becomes LOW during 1 clock interval of the read clock, RCLK, before becoming HIGH. Further, since the read ready signal RRDY-0 is HIGH, as shown in FIG. 12, the read acknowledge signal generating section 6 shifts to the Ir state. At this time, as shown in FIG. 13, the read acknowledge signal ACK-0 becomes HIGH.

As shown in FIG. 10, when the read acknowledge signal ACK-10 becomes HIGH, the ready signal generating section 3 shifts the Iw state. At this time, as shown in FIG. 11, the write ready signal becomes LOW, and the read ready signal RRDY-0 becomes HIGH. Repetition of such operation enables the write data WD to be converted to the read data RD continuously without occurrence of lack of the data or redundancy of the data.

Figure 7:
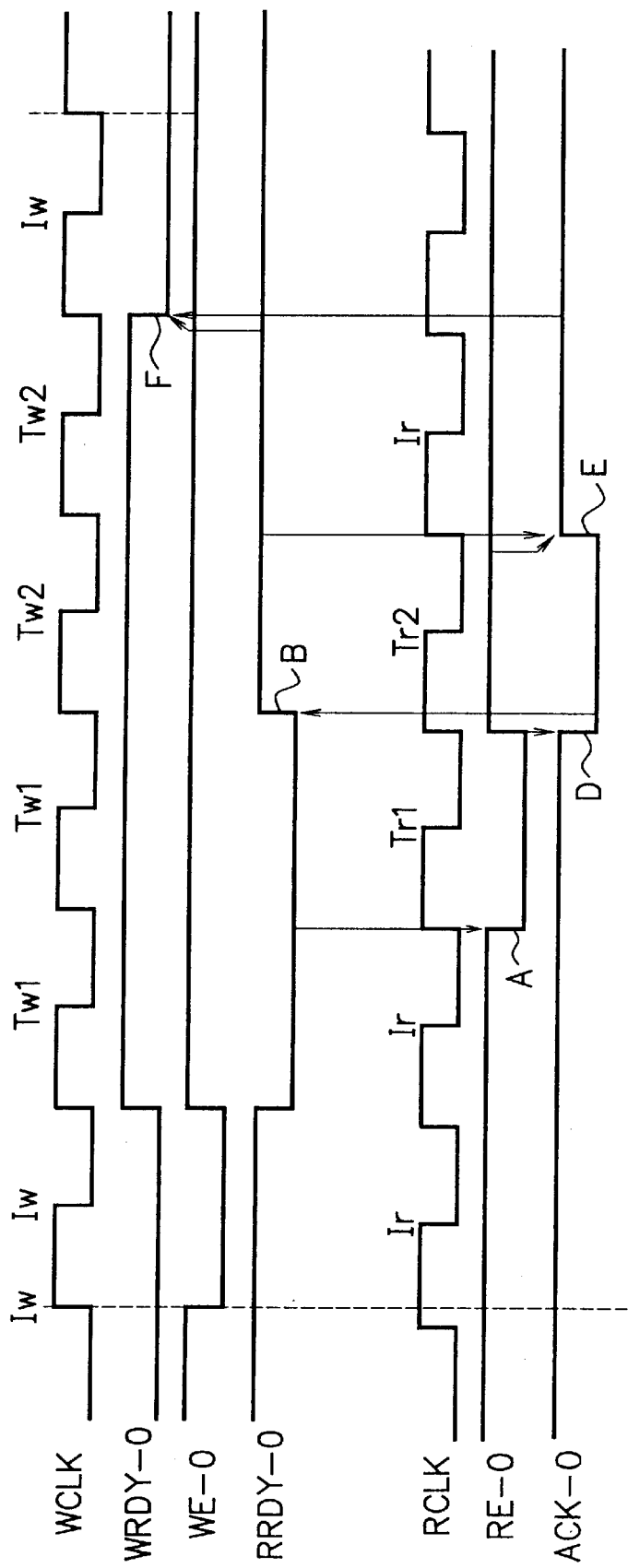
FIG. 7 is a timing chart showing an example of timing when the difference of speed in between a write clock and a read clock is small in the second embodiment.
Figure 8:
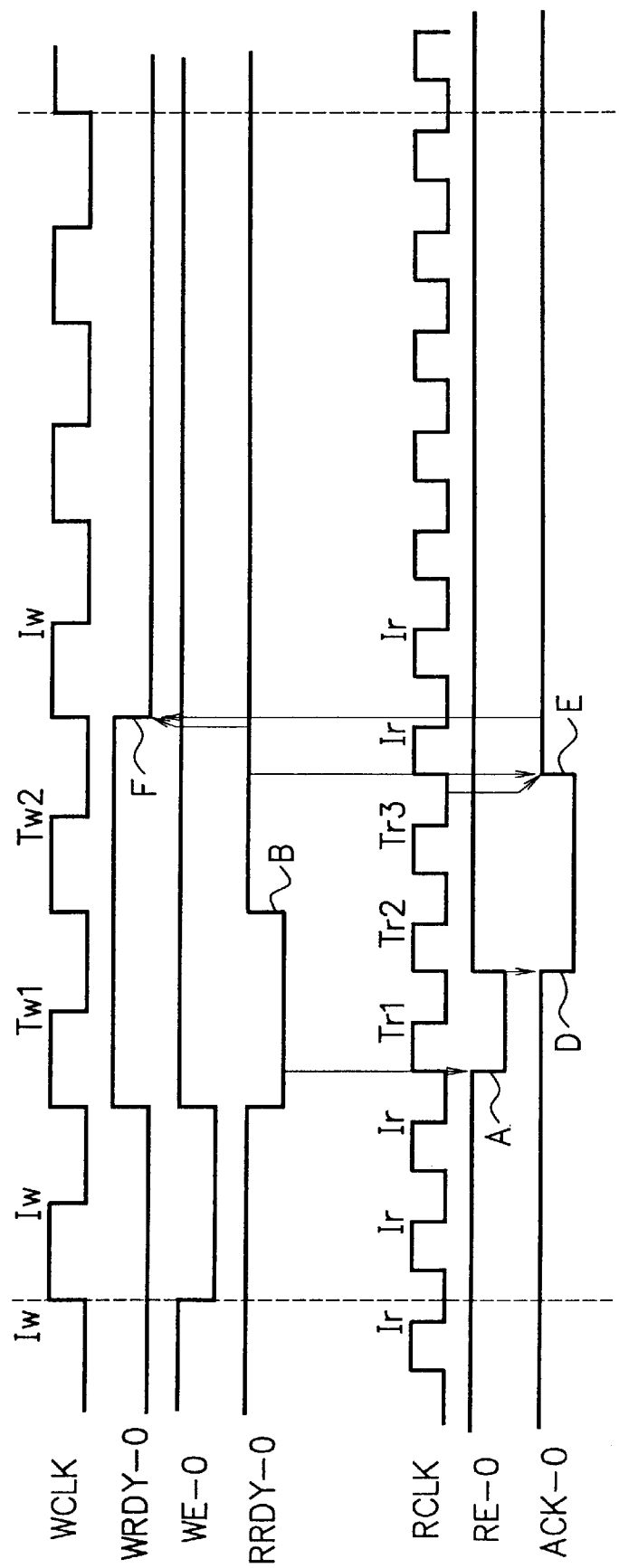
FIG. 8 is a timing chart showing an example of timing when the read clock is faster than the write clock in they second embodiment.

FIG. 7 shows one example of the timing when the write clock WCLK is not fast sufficiently in comparison with the read clock RCLK. Further, FIG. 8 shows one example of the timing when the write clock WCLK is slow in comparison with the read clock RCLK. In any of these cases, data conversion is capable of performing stably in the same way as the case of FIG. 6 by virtue of the operation relationship in between the read acknowledge signal generating section 6 and the ready signal generating section 3 without reference to the speed of the write clock WCLK and the read clock RCLK.

Figure 9:
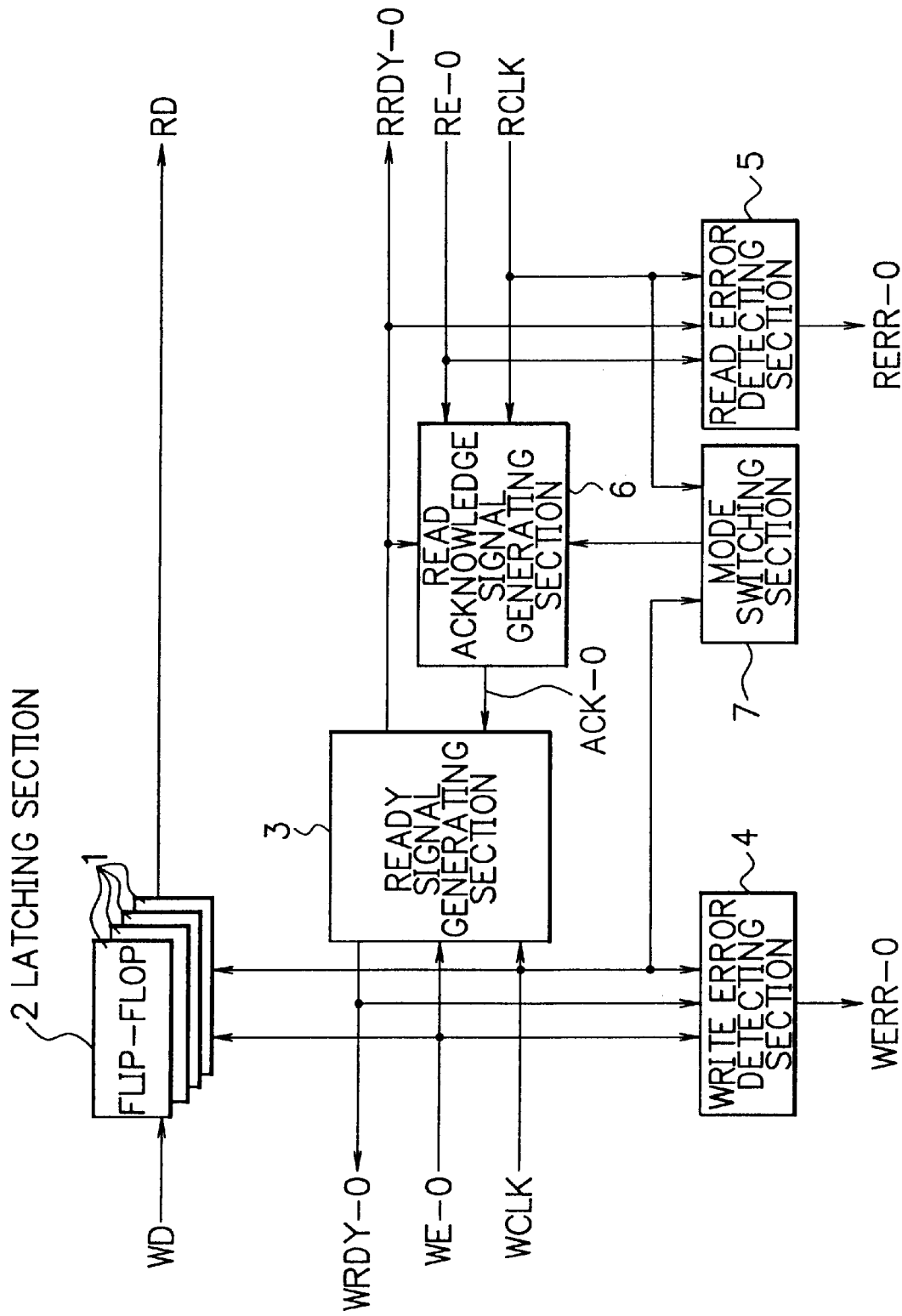
FIG. 9 is a block diagram showing a third embodiment of the present invention.

Next, there will be described a third embodiment of the present invention shown in FIG. 9. The system is provided with a mode switching section 7 in addition to the configuration shown in FIG. 5. The mode switching section 7 detects speed difference between the write clock WCLK and the read clock RCLK, when speed of the write clock WCLK is sufficiently faster than the read clock RCLK, it causes the read acknowledge signal generating section 6 to be set to "A-Mode" to output the read enable signal RE-0 as it is by way of the read acknowledge signal ACK-0. The operation of this case becomes the same operation as that of the first embodiment of FIG. 1.

Furthermore, when the speed of the write clock WCLK is not sufficiently faster than the read clock RCLK, switching section 7 causes the read acknowledge signal generating section 6 to be switched into "B-Mode". The operation of this case becomes the operation of the second embodiment of FIG. 5.

As described above according to the present invention, from the state relationship of HIGH/LOW in between the write enable signal and the read enable signal, since it causes the write ready signal with the writing to the latching section as holding state, and the read ready signal with the reading-out from the latching section as holding state to be generated synchronously with the write clock WCLK, it is capable of preventing lack of the data or redundancy of the data.

According to one aspect of the present invention, from the state relationship of HIGH/LOW in between the read enable signal and the read ready signal, since it causes the read acknowledge signal to be generated synchronously with the read clock, it is capable of preventing lack of the data or redundancy of the data even though the speed difference in between the write clock and the read clock is not sufficiently large.

According to another aspect of the present invention, it is capable of securing high conversion efficiency and reliability without influence of size of difference of the clock because the operation mode is switched in answer to the case where speed difference in between the write clock and the read clock is sufficiently large, and the case where speed difference in between the write clock and the read clock is not sufficiently large.

According to still another aspect of the present invention, if lack of data or redundancy of data occurs, such problems can be detected by way of error.

While preferred embodiments of the invention have been described using specific terms, such description is for illustrative purpose only, and it is to be understood that changes and variations may be made without departing from the spirit or scope of the following claims.

What is claimed is:

1. An asynchronous data conversion system wherein input data is written in a latching section synchronously with a write clock in accordance with a write enable signal, subsequently the written data is read-out synchronously with a read clock asynchronous with said write clock in accordance with a read enable signal, comprising:
    a ready signal generating section which generates a write ready signal with a writing to said latching section as a holding state, and a read ready signal with a reading from said latching section as said holding state, synchronously with said write clock, based on a state of said write enable signal and said read enable signal.

2. An asynchronous data conversion system wherein input data is written in a latching section synchronously with a write clock in accordance with a write enable signal, subsequently the written data is read-out synchronously with a read clock asynchronous with said write clock in accordance with a read enable signal, comprising:
    a ready signal generating section which generates a write ready signal with a writing to said latching section as a holding state, and a read ready signal with a reading from said latching section as a holding state, synchronously with said write clock, based on a state of said write enable signal and a read acknowledge signal; and
    a read acknowledge signal generating section which generates said acknowledge signal synchronously with said read clock, based on the state of said read enable signal and said read ready signal.

3. An asynchronous data conversion system wherein input data is written in a latching section synchronously with a write clock in accordance with a write enable signal, subsequently the written data is read-out synchronously with a read clock asynchronous with said write clock in accordance with a read enable signal, comprising:
    a ready signal generating section which generates a write ready signal with a writing to said latching section as a holding state, and a read ready signal with a reading from said latching section as said holding state, synchronously with said write clock based on a state of said write enable signal and a read acknowledge signal;
    a read acknowledge signal generating section which generates said acknowledge signal synchronously with said read clock, based on the state of said read enable signal and said read ready signal; and
    a mode switching section which controls said read acknowledge signal generating section so as to output said read enable signal by way of said read acknowledge signal when a speed of said write clock is sufficiently faster than said read clock, while detecting a speed difference between said write clock and said read clock, and which controls said read acknowledge signal generating section so as to generate said read acknowledge signal synchronously with said read clock based on a state of said read enable signal and said read ready signal when said speed of said write clock is not sufficiently faster than said read clock.

4. An asynchronous data conversion system as claimed in claim 1, further comprising:
    a write error detecting section which outputs a write error signal synchronously with said read clock depending on a state of said write enable signal and said write ready signal; and
    a read error detecting section which outputs a read error signal synchronously with said read clock depending on a state of said read enable signal and said read ready signal.

5. An asynchronous data conversion system as claimed in claim 2, further comprising:
    a write error detecting section which outputs a write error signal synchronously with said read clock depending on a state of said write enable signal and said write ready signal; and
    a read error detecting section which outputs a read error signal synchronously with said read clock depending on a state of said read enable signal and said read ready signal.

6. An asynchronous data conversion system as claimed in claim 3, further comprising:
    a write error detecting section which outputs a write error signal synchronously with said read clock depending on a state of said write enable signal and said write ready signal; and
    a ready error detecting section which outputs a read error signal synchronously with a read clock depending on a state of said read enable signal and sad read ready signal.

7. An asynchronous data conversion method wherein input data is written in a latching section synchronously with a write clock in accordance with a write enable signal, subsequently the written data is read-out synchronously with a read clock asynchronous with said write clock in accordance with a read enable signal, comprising:
    generating a write ready signal with a writing to said latching section as a holding state, and a read ready signal with a reading from said latching section as said holding state, synchronously with said write clock, depending on a state of said write enable signal and said read enable signal.

8. An asynchronous data conversion method wherein input data is written in a latching section synchronously with a write clock in accordance with a write enable signal, subsequently the written data is read-out synchronously with a read clock which is asynchronous with said write clock in accordance with a read enable signal, comprising:
    generating a write ready signal with a writing to said latching section as a holding state, and a read ready signal with a reading from said latching section as said holding state synchronously with said write clock based on a state of said write enable signal and a read acknowledge signal; and
    generating said acknowledge signal synchronously with said read clock based on the state of said read enable signal and said read ready signal.

9. An asynchronous data conversion method wherein input data is written in a latching section synchronously with a write clock in accordance with a write enable signal, subsequently the written data is read-out synchronously with a read clock asynchronous with said write clock in accordance with a read enable signal, comprising:

generating a write ready signal with a writing to said latching section as a holding state, and a read ready signal with a reading from said latching section as said holding state synchronously with said write clock based on a state of said write enable signal and a read acknowledge signal;

generating said acknowledge signal synchronously with said read clock based on the state of said read enable signal and said read ready signal; and controlling a read acknowledge signal generating section so as to output said read enable signal by way of said read acknowledge signal when a speed of said write clock is sufficiently faster than said read clock while detecting a speed difference between said write clock and said read clock, and controlling said read acknowledge signal generating section so as to generate a read acknowledge signal synchronously with said read clock based on a state said read enable signal and said read ready signal when said speed of said write clock is not sufficiently faster than said read clock.

10. An asynchronous data conversion method as claimed in claim 7, further comprising:

outputting a write error signal synchronously with said read clock depending on a state of said write enable signal and said write ready signal; and outputting a read error signal synchronously with said read clock depending on a state of said read enable signal and said read ready signal.

11. An asynchronous data conversion method as claimed in claim 8, further comprising:

outputting a write error signal synchronously with said read clock depending on a state of said write enable signal and said write ready signal; and outputting a read error signal synchronously with said read clock depending on a state of said read enable signal and said read ready signal.

12. An asynchronous data conversion method as claimed in claim 9, further comprising:

outputting a write error signal synchronously with said read clock depending on a state of said write enable signal and said write ready signal; and outputting a read error signal synchronously with said read clock depending on a state of said read enable signal and said read ready signal.

13. An asynchronous data conversion system wherein input data is written into a latching section synchronous with a write clock in accordance with a write enable signal, and said input data is read out from said latching section synchronously with a read clock, said read clock being asynchronous with said write clock, said input data being read out in accordance with a read enable signal, said data conversion system comprising:

a latching section; and a ready signal generating section which generates a write ready signal that enables a writing of said input data to said latching section as a holding state, and a read ready signal that enables a reading of said input data from said latching section as said holding state, being said ready signals synchronous with said write clock and being based on a state of said write enable signal and said read enable signal.

14. An asynchronous data conversion system wherein input data is written into a latching section synchronous with a write clock in accordance with a write enable signal, and said input data is read out from said latching section synchronously with a read clock, said read clock being asynchronous with said write clock, said input data being read out in accordance with a read enable signal, said data conversion system comprising:

a ready signal generating section which generates a write ready signal that enables a writing of said input data to said latching section as a holding state, and a read ready signal that enables a reading of said input data from said latching section as said holding state, said ready signals being synchronous with said write clock and being based on a state of said write enable signal and a read acknowledge signal;

a read acknowledge signal generating section which generates said acknowledge signal synchronous with said read clock and based on the state of said read enable signal and said read ready signal; and a mode switching section which controls said read acknowledge signal generating section so as to output said read enable signal by way of said read acknowledge signal when a speed of said write clock is faster than said read clock by a threshold, said mode switching section detecting a speed difference between said write clock and said read clock, and said mode switching section controlling said read acknowledge signal generating section to generate said read acknowledge signal synchronous with said read clock based on a state of said read enable signal and said read ready signal when said speed of said write clock is not faster than said read clock by said threshold.

15. A method for converting a frequency of input data wherein said input data is written into a latching section synchronous with a write clock in accordance with a write enable signal, and said input data is read out of said latching section synchronous with a read clock, said read clock being asynchronous with said write clock, said input data being read out in accordance with a read enable signal, said method comprising:

generating a write ready signal which enables a writing of said input data to said latching section as a holding state; and generating a read ready signal which enables a reading of said input data from said latching section as said holding state;

wherein said write ready signal and said read ready signal are synchronous with said write clock, and are dependent upon a state of said write enable signal and said read enable signal.

16. A method for converting a frequency of input data wherein said input data is written into a latching section synchronous with a write clock in accordance with a write enable signal, and said input data is read out of said latching section synchronous with a read clock, said read clock being asynchronous with said write clock, said input data being read out in accordance with a read enable signal, said method comprising:

generating a write ready signal which enables a writing of said input data to said latching section as a holding state;

generating a read ready signal which enables a reading of said input data from said latching section as said holding state;

wherein said write ready signal and said read ready signal are synchronous with said write clock, and are dependent upon a state of said write enable signal and a read acknowledge signal;

generating said acknowledge signal synchronous with said read clock and based on the state of said read enable signal and said read ready signal;

detecting a speed difference between said write clock and said read clock;

controlling a read acknowledge signal generating section so as to output said read enable signal by way of said read acknowledge signal when a speed of said write clock is faster than said read clock by a threshold; and controlling said read acknowledge signal generating section so as to generate a read acknowledge signal synchronous with said read clock based on a state of said read enable signal and said read ready signal when said speed of said write clock is not faster than said read clock by said threshold.

* * * * *